(12) United States Patent
Xie

(10) Patent No.: US 8,609,480 B2
(45) Date of Patent: Dec. 17, 2013

(54) METHODS OF FORMING ISOLATION STRUCTURES ON FINFET SEMICONDUCTOR DEVICES

(75) Inventor: Ruilong Xie, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 138 days.

(21) Appl. No.: 13/332,676

(22) Filed: Dec. 21, 2011

(65) Prior Publication Data

US 2013/0161729 A1   Jun. 27, 2013

(51) Int. Cl.
*H01L 21/8234* (2006.01)

(52) U.S. Cl.
USPC ........... 438/197; 438/435; 438/444; 438/691; 438/694; 257/E21.249

(58) Field of Classification Search
USPC .................. 438/197, 435, 444, 691, 694; 257/E21.249
See application file for complete search history.

(56) References Cited

U.S. PATENT DOCUMENTS

| | | | |
|---|---|---|---|
| 7,329,581 B2 | 2/2008 | Kang et al. | |
| 7,358,142 B2 | 4/2008 | Kang et al. | |
| 7,491,589 B2 | 2/2009 | Anderson et al. | |
| 7,842,566 B2 | 11/2010 | Lee et al. | |
| 7,919,335 B2 | 4/2011 | Xiao et al. | |
| 8,039,326 B2 | 10/2011 | Knorr et al. | |
| 2007/0004129 A1 | 1/2007 | Lee et al. | |
| 2008/0203491 A1 | 8/2008 | Anderson et al. | |
| 2009/0020792 A1 | 1/2009 | Rios et al. | |
| 2010/0078711 A1* | 4/2010 | Goldbach et al. | 257/329 |
| 2010/0248454 A1 | 9/2010 | Maszara et al. | |
| 2011/0068431 A1 | 3/2011 | Knorr et al. | |
| 2012/0091538 A1* | 4/2012 | Lin et al. | 257/401 |

* cited by examiner

*Primary Examiner* — Thanh V Pham
(74) *Attorney, Agent, or Firm* — Williams, Morgan & Amerson, P.C.

(57) ABSTRACT

One illustrative method disclosed herein includes performing at least one etching process on a semiconducting substrate to form a plurality of trenches and a plurality of fins for the FinFET device in the substrate, forming a first layer of insulating material in the trenches, wherein an upper surface of the first layer of insulating material is below an upper surface of the substrate, forming an isolation layer within the trenches above the first layer of insulating material, wherein the isolation layer has an upper surface that is below the upper surface of the substrate, forming a second layer of insulating material above the isolation layer, wherein the second layer of insulating material has an upper surface that is below the upper surface of the substrate, and forming a gate electrode structure above the second layer of insulating material.

19 Claims, 10 Drawing Sheets

US 8,609,480 B2

1

METHODS OF FORMING ISOLATION STRUCTURES ON FINFET SEMICONDUCTOR DEVICES

BACKGROUND OF THE INVENTION

1. Field of the Invention

Generally, the present disclosure relates to the manufacturing of sophisticated semiconductor devices, and, more specifically, to various methods of forming isolation structures on FinFET semiconductor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, no current flows through the device, ignoring undesirable leakage currents which are relatively small. However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as so-called short channel effects, wherein the characteristic of the FET as an active switch is degraded.

In contrast to a FET, which has a planar structure, a FinFET device is a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semi-conducting substrate so as to reduce the physical size of the semiconductor device. Also, in a FinFET, the junction capacitance at the drain region of the device is greatly reduced, which tends to reduce at least some short channel effects.

The fins on a FinFET device are typically formed by performing an etching process through a patterned mask layer to define a plurality of trenches in a semiconducting substrate, wherein remaining silicon between the trenches are the fins. Electrical isolation of the fin structures on a FinFET device is provided in order to avoid electromagnetic interference (EMI) and/or parasitic leakage paths between various devices. One illustrative prior art technique of forming isolation structures on a FinFET device 10 is shown in FIGS. 1A-1D. As shown in FIG. 1A, and as mentioned above, a plurality of fins 18 are defined in a semi-conducting substrate 12 by performing an etching process through a patterned mask layer 14, e.g., a silicon nitride mask layer. Next, as shown in FIG. 1B, a layer of silicon dioxide 20 is deposited above the device and in the trenches between the fins 18. A chemical mechanical polishing (CMP) process is then performed on the layer of silicon dioxide 20 using the patterned mask layer 14 as a polish-stop layer, as reflected in FIG. 1C. Thereafter, an etching process is performed to reduce the thickness of the layer of silicon dioxide to the final isolation layer 20A. In some embodiments, the final isolation layer 20A may have a thickness on the order of about 10-30 nm.

Unfortunately, the final isolation layer 20A is subject to attack in many subsequent processing operations, such as various cleaning operations that typically involve using hydrofluoric acid, with resulting loss of at least some of the isolation material. In some cases, the final isolation layer 20A may be eroded to such an extent that it can no longer effectively serve its intended function. In other cases, the undesirable consumption of the final isolation layer 20A may not be uniform across the surface of the substrate 12. The resulting uneven amounts of isolation material between the fins 18 may create FinFETs with undesirable variations in electrical performance characteristics. As a specific example, in FinFET devices wherein portions of the fins 18 are merged together to form source/drain regions, variations in thickness of the isolation layer 20A can lead to the formation of source/drain regions having regions of unequal thickness on the final FinFET device which may adversely impact device performance.

The present disclosure is directed to various methods of forming isolation structures on FinFET semiconductor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming isolation structures on FinFET semiconductor devices. One illustrative method disclosed herein includes performing at least one etching process on a semi-conducting substrate to form a plurality of trenches and a plurality of fins for the FinFET device in the substrate, forming a first layer of insulating material in the trenches, wherein an upper surface of the first layer of insulating material is below an upper surface of the substrate, forming an isolation layer within the trenches above the first layer of insulating material, wherein the isolation layer has an upper surface that is below the upper surface of the substrate, forming a second layer of insulating material above the isolation layer, wherein the second layer of insulating material has an upper surface that is below the upper surface of the substrate, and forming a gate electrode structure above the second layer of insulating material.

In another illustrative example, a method is disclosed that includes performing at least one etching process on a semi-conducting substrate to form a plurality of trenches and a plurality of fins for the FinFET device in the substrate, forming an isolation layer in the trenches, wherein the isolation layer has an upper surface that is below an upper surface of the substrate, forming a layer of insulating material above the isolation layer, wherein the layer of insulating material has an upper surface that is below the upper surface of the substrate, and forming a gate electrode structure above the isolation layer.

One illustrative FinFET device disclosed herein includes a plurality of fins separated by a trench formed in a semiconducting substrate, a first layer of insulating material positioned in the trench, wherein the first layer of insulating material has an upper surface that is below an upper surface of the substrate, an isolation layer positioned within the trench above the first layer of insulating material, wherein the isolation layer has an upper surface that is below the upper surface of the substrate, a second layer of insulating material positioned within the trench above the isolation layer, wherein the second layer of insulating material has an upper surface that is below the upper surface of the substrate, and a gate electrode structure positioned above the second layer of insulating material.

Yet another illustrative FinFET device disclosed herein includes a plurality of fins separated by a trench formed in a semiconducting substrate, wherein the trench has a bottom, an isolation layer positioned at the bottom of the trench, wherein the isolation layer has an upper surface that is below an upper surface of the substrate, a layer of insulating material positioned within the trench above the isolation layer, wherein the layer of insulating material has an upper surface that is below the upper surface of the substrate, and a gate electrode structure positioned above the layer of insulating material.

BRIEF DESCRIPTION OF THE DRAWINGS

The disclosure may be understood by reference to the following description taken in conjunction with the accompanying drawings, in which like reference numerals identify like elements, and in which.

Figure 1A:
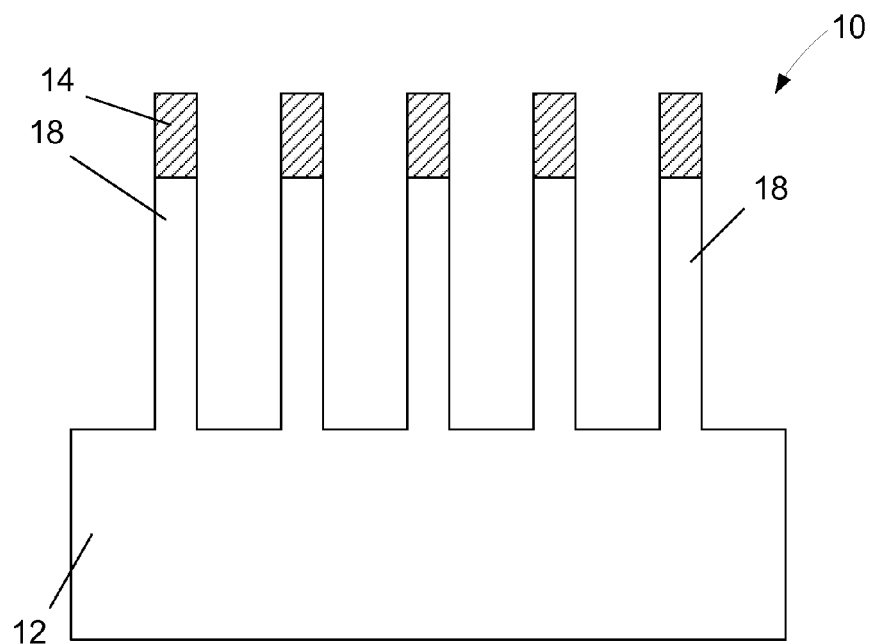
FIGS. 1A-1D depict one illustrative prior art technique for forming isolation structures on FinFET semiconductor devices.
Figure 1B:
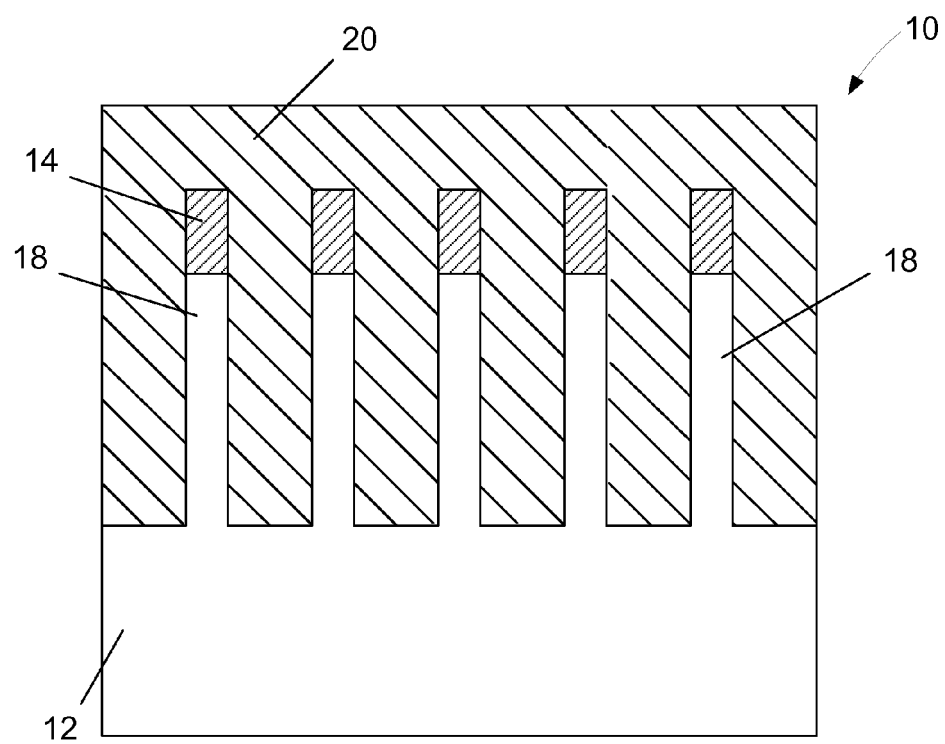
Figure 1C:
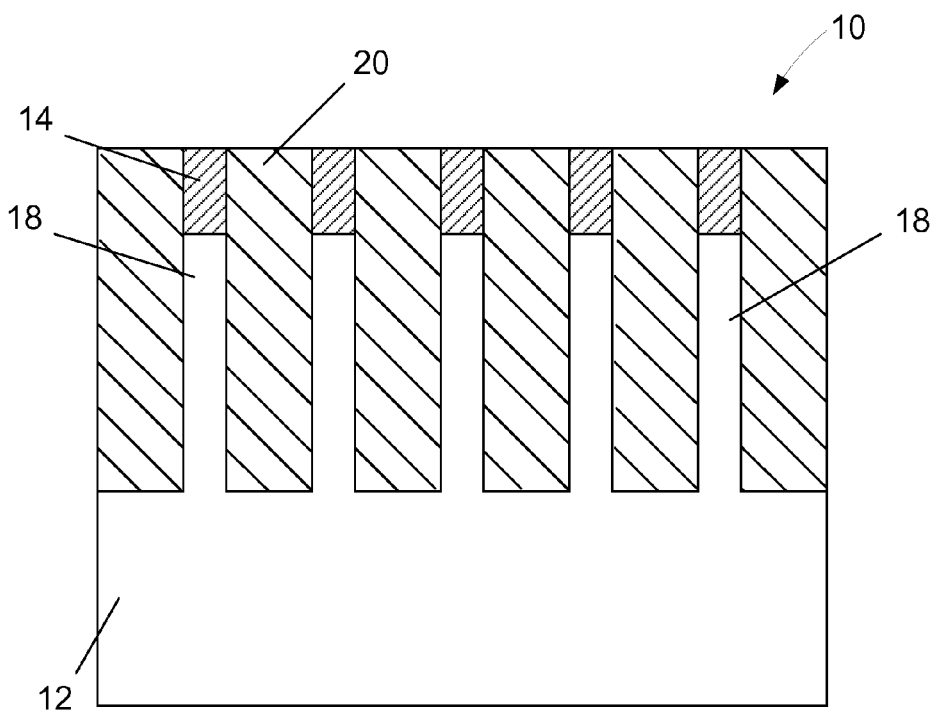
Figure 1D:
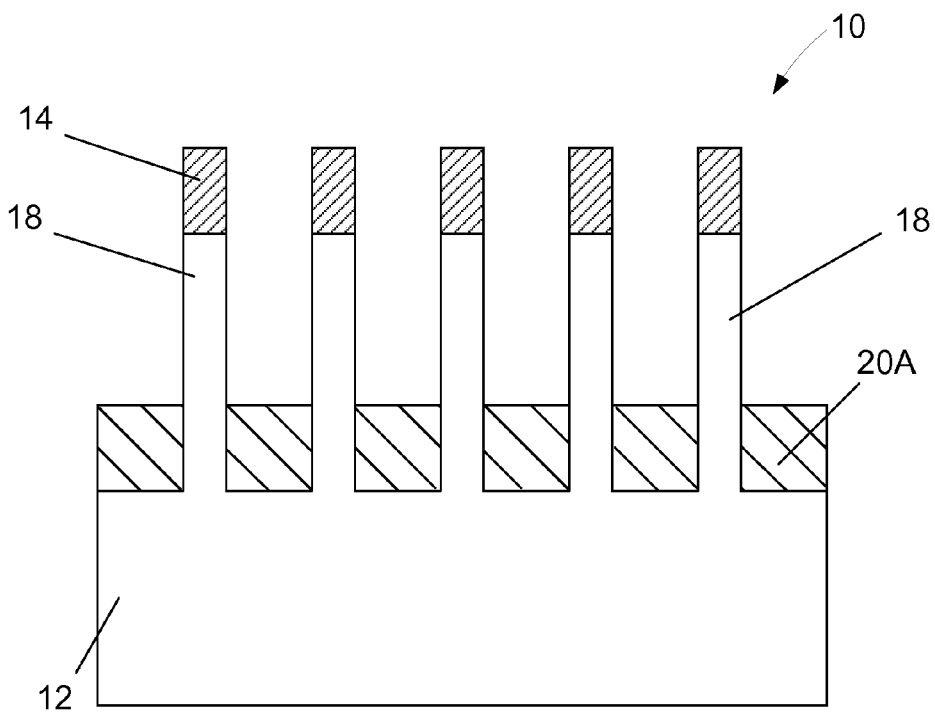

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming isolation structures on FinFET semiconductor devices. As will be readily apparent to those skilled in the art upon a complete reading of the present application, the present method is applicable to a variety of devices, including, but not limited to, N-FinFET devices and P-FinFET devices, and the use of such FinFET devices in ASICs, logic devices, memory devices, etc. With reference to the attached drawings, various illustrative embodiments of the methods and devices disclosed herein will now be described in more detail.

Figure 2A:
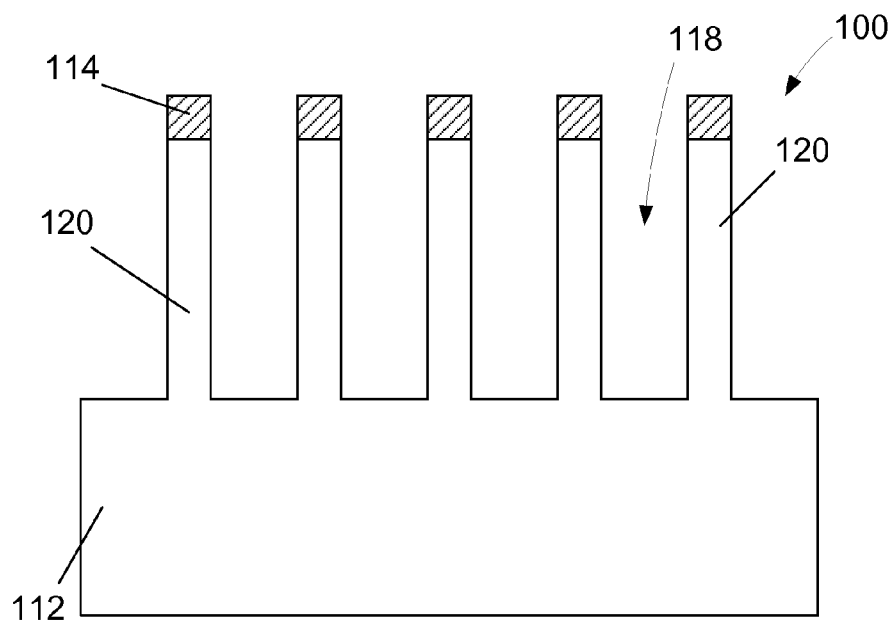
FIGS. 2A-2J depict one of the illustrative methods disclosed herein for forming isolation structures on FinFET semiconductor devices.

FIGS. 2A-2J depict one illustrative process flow disclosed herein for forming isolation structures on FinFET semiconductor devices. FIG. 2A is a simplified view of an illustrative FinFET semiconductor device 100 at an early stage of manufacturing. The FinFET semiconductor device 100 may be either a P-FinFET or an N-FinFET. The device 100 is formed above a bulk semiconducting substrate 112 that may be comprised of silicon or other semiconducting materials.

At the point of fabrication depicted in FIG. 2A, a patterned mask layer 114, such as a patterned hard mask layer comprised of silicon nitride, has been formed above the substrate 112 using known photolithography and etching techniques. The patterned mask layer 114 is intended to be representative in nature as it could be comprised of a variety of materials, such as, for example, a photoresist material, silicon nitride, silicon oxynitride, silicon dioxide, amorphous carbon, etc. Moreover, the patterned mask layer 114 could also be comprised of multiple layers of material, such as, for example, a pad oxide layer (not shown) that is formed on the substrate 112 and a pad nitride layer (not shown) that is formed on the pad oxide layer. Thus, the particular form and composition of the patterned mask layer 114, and the manner in which it is made, should not be considered a limitation of the present invention. In the case where the patterned mask layer 114 is comprised of one or more hard mask layers, such layers may be formed by performing a variety of known processing techniques, such as a chemical vapor deposition (CVD) process, an atomic layer deposition (ALD) process, or plasma-enhanced versions of such processes, and the thickness of such a layer(s) may vary depending upon the particular application. In one illustrative embodiment, the patterned mask layer 114 is a hard mask layer of silicon nitride having a thickness of about 10-40 nm that is initially formed by performing a CVD process and thereafter patterned using known photolithographic and etching techniques.

With continuing reference to FIG. 2A, an etching process, such as a dry or wet etching process, is performed on the substrate 112 through the patterned mask layer 114 to form a plurality of trenches 118. This etching process results in the definition of a plurality of fins 120. The overall size, shape and configuration of the trenches 118 and fins 120 may vary depending on the particular application. The depth and width of the trenches 118 and the height and thickness of the fins 120 may vary depending upon the particular application. In one illustrative embodiment, based on current day technology, the height of the fins 120 (or depth of the trenches 118) at this point in the process may range from approximately 40-120 nm and the width of the fins 120 may range from about 8-20 nm. In the example of the device 100 depicted herein, the trenches 118 and fins 120 are all of a uniform size and shape. However, such uniformity in the size and shape of the trenches 118 and/or the fins 120 is not required to practice at least some aspects of the inventions disclosed herein. In the example depicted in FIG. 2A, the trenches 118 are formed by performing an anisotropic etching process that results in the trenches 118 having a schematically depicted, generally rectangular configuration. In an actual real-world device, the sidewalls of the trenches 118 may be somewhat inwardly tapered, although that configuration is not depicted in the drawings. For ease of disclosure, the substantially rectangular trenches 118 will be depicted in subsequent drawings.

Figure 2B:
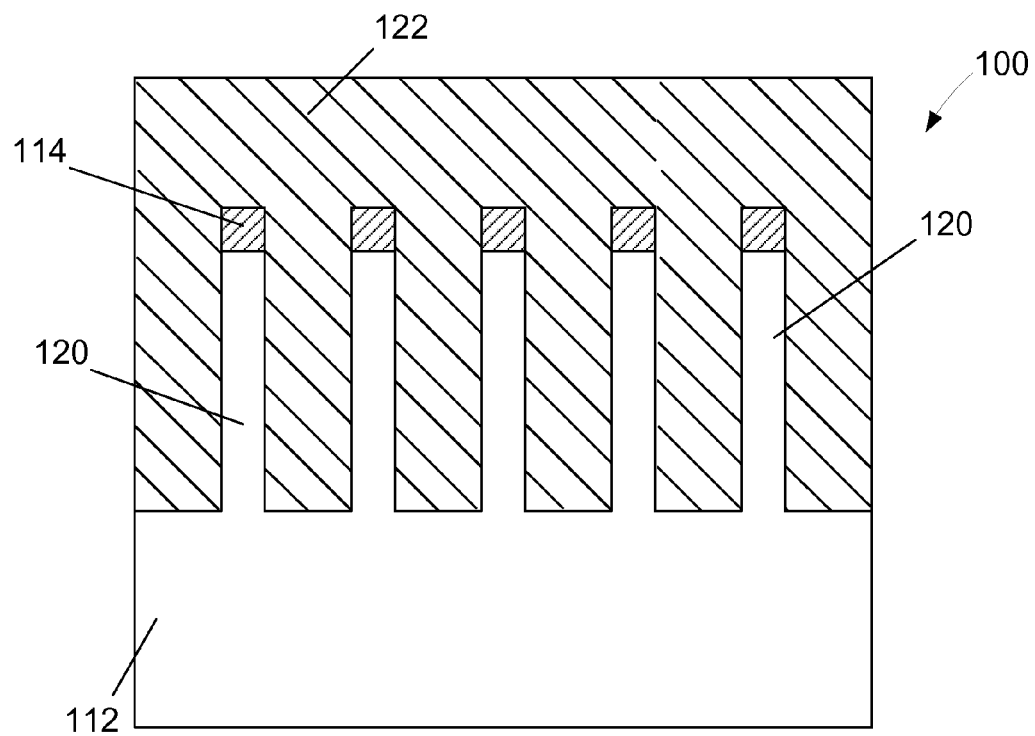

Next, as shown in FIG. 2B, a first layer of insulating material 122 is deposited across the device 100 and overfills the trenches 118. The first layer of insulating material 122 may be comprised of a variety of insulating materials, such as, for example, silicon dioxide, silicon carbon oxide, etc. The first layer of insulating material 122 may be formed by performing a variety of known processing techniques, such as a chemical vapor deposition (CVD) process, an atomic layer deposition (ALD) process, or plasma-enhanced versions of such processes. In one illustrative embodiment, the first layer of insulating material 122 is a layer of silicon dioxide that is initially formed by performing a plasma-enhanced CVD process. In the depicted example, the illustrative patterned hard mask layer 114 is left in place, although that may not be the case in all applications. For example, if the FinFET device 100 to be formed is a tri-channel device, then the patterned hard mask layer 114 may be removed prior to forming the layer of insulating material 122.

Figure 2C:
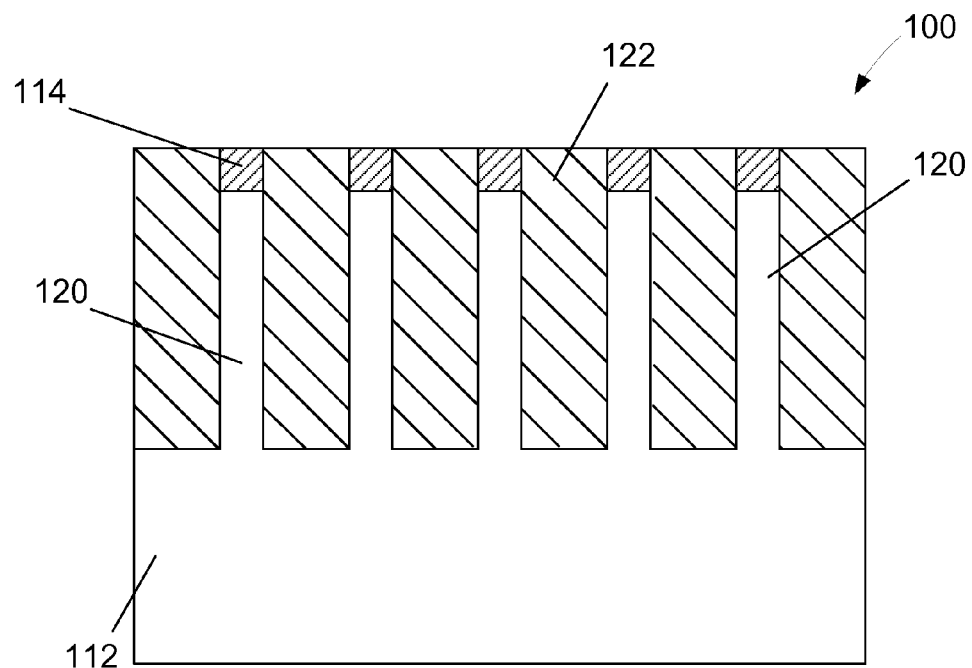
Figure 2D:
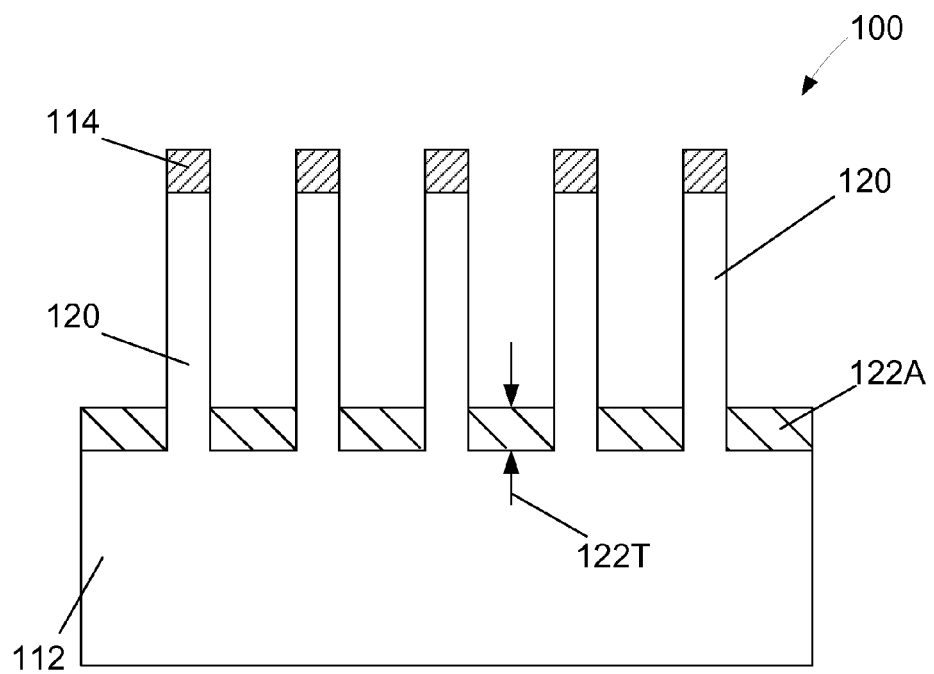

Next, as shown in FIG. 2C, a chemical mechanical polishing (CMP) process is performed on the device 100 using the patterned hard mask layer 114 as a polish-stop layer to remove portions of the first layer of insulating material 122 and to planarize its surface. Then, as shown in FIG. 2D, one or more etching processes is performed on the first layer of insulating material 122 to reduce its overall thickness and thereby define a reduced thickness layer of insulating material 122A. The etching process may be either a wet or dry etching process. The final thickness 122T of the reduced thickness layer of insulating material 122A may vary depending upon the particular application. In one illustrative embodiment, the final thickness 122T of the reduced thickness layer of insulating material 122A may be about 10-70 nm.

Figure 2E:
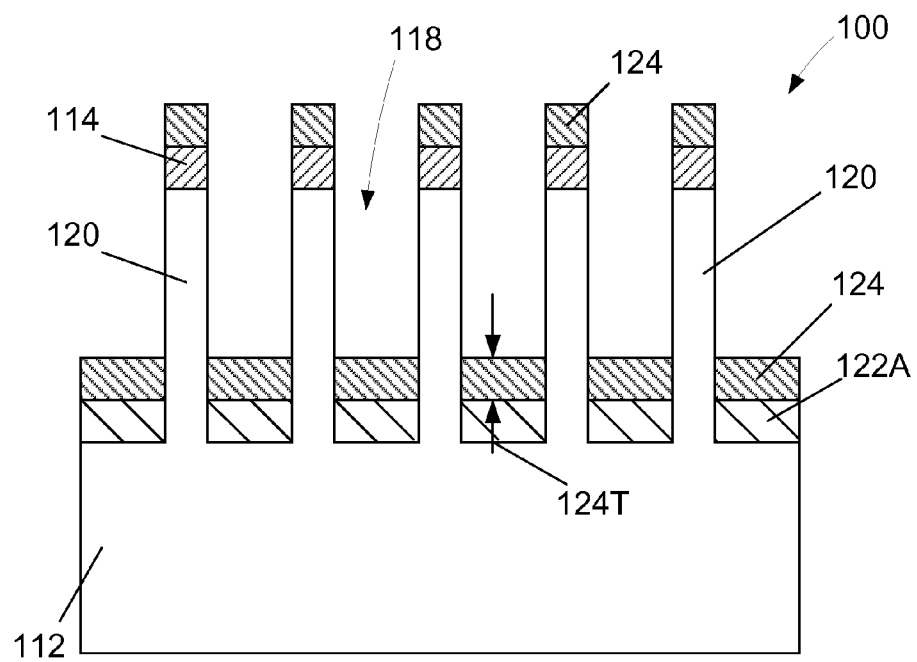

Next, as shown in FIG. 2E, an isolation layer 124 is formed on the device 100. More specifically, the isolation layer 124 is formed on the reduced thickness layer of insulating material 122A at the bottom of the trenches 118 and on the patterned hard mask layer 114. The isolation layer 124 may be comprised of a variety of insulating materials, such as, for example, silicon nitride, silicon oxynitride, etc., and its thickness 124T may vary depending upon the particular application, e.g., its thickness may range from 5-30 nm. In general, the isolation layer may be comprised of a material that is resistant to being etched with HF acid, or a material that allows for selective etching of silicon dioxide relative to that material. In one illustrative embodiment, the isolation layer 124 is made of silicon nitride and it may be formed by performing a directional deposition process, such as a gas cluster ion beam (GCIB) process. The GCIB process may be performed with a masking layer (a masked process) or without a masking layer (a blanket process). If employed, such a masking layer may be comprised of a photoresist mask or a hard mask. However, so as not to obscure the present invention, such a masking layer is not depicted in the drawings. In the illustrative case where the isolation layer 124 is comprised of silicon nitride, depending upon the desired thickness of the resulting isolation layer 124, the GCIB process may be performed at an energy level ranging from approximately 5-60 keV and it may be performed at about room temperature using $SiH_4$ and $N_2$ clusters, wherein each cluster may contain thousands of molecules.

Figure 2F:
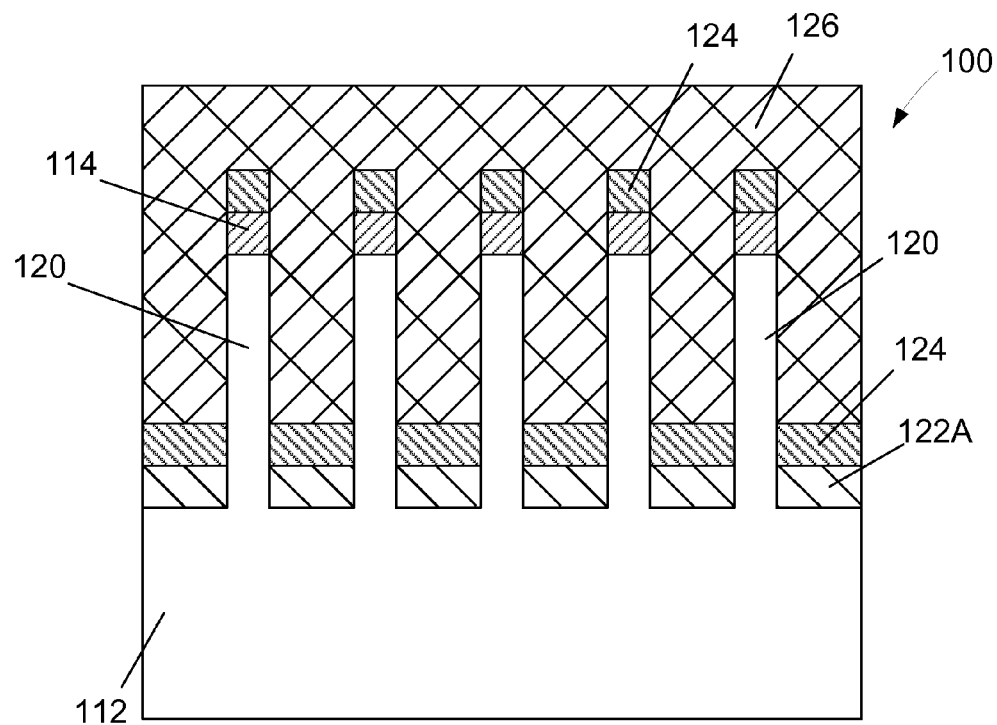

Next, as shown in FIG. 2F, a second layer of insulating material 126 is deposited across the device 100 and overfills the trenches 118. The second layer of insulating material 126 may be comprised of a variety of insulating materials, such as, for example, silicon dioxide, silicon carbon oxide, etc. The second layer of insulating material 126 may be formed by performing a variety of known processing techniques, such as a chemical vapor deposition (CVD) process, an atomic layer deposition (ALD) process, or plasma-enhanced versions of such processes. In one illustrative embodiment, the second layer of insulating material 126 is a layer of silicon dioxide that is initially formed by performing a plasma-enhanced CVD process.

Figure 2G:
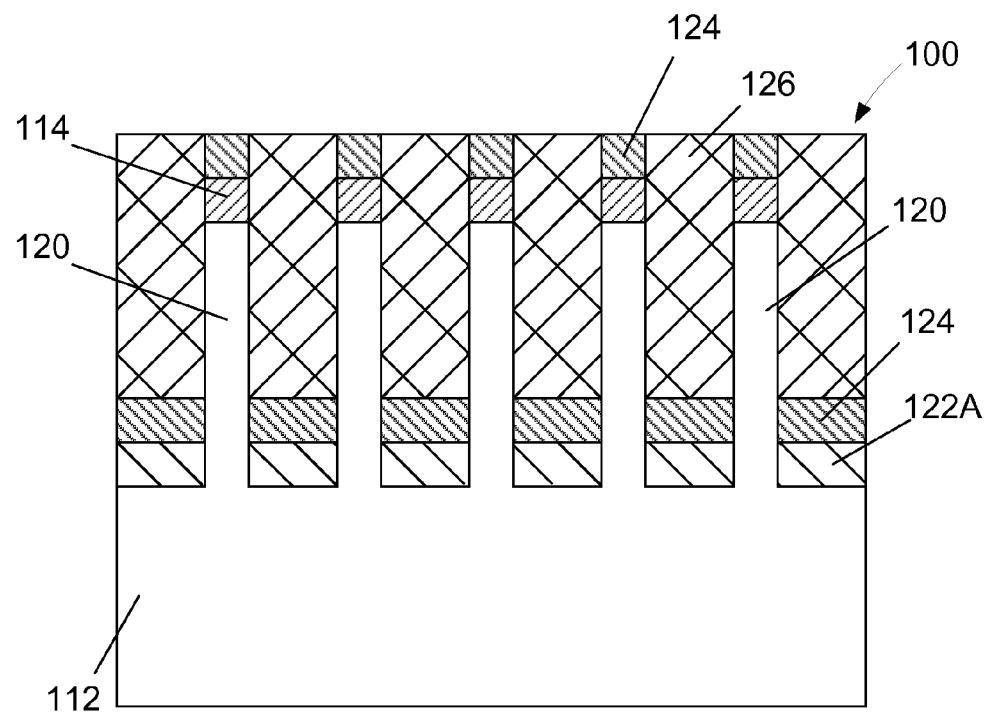
Figure 2H:
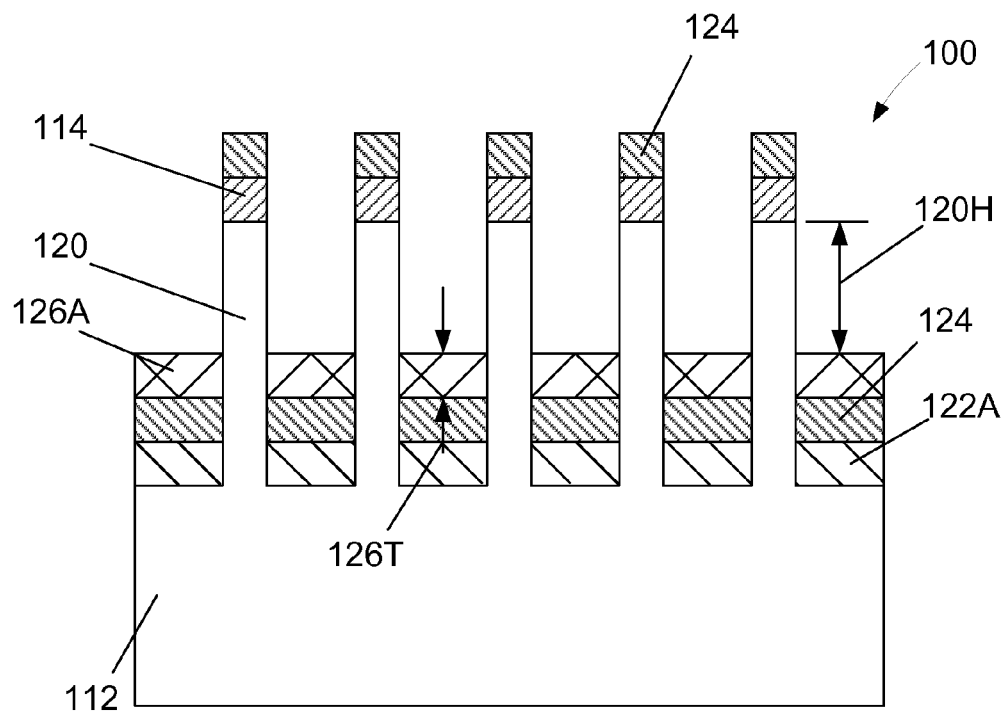

Next, as shown in FIG. 2G, a chemical mechanical polishing (CMP) process is performed on the device 100 using the isolation layer 124 as a polish-stop layer to remove portions of the second layer of insulating material 126 and to planarize its surface. Then, as shown in FIG. 2H, one or more etching processes is performed on the second layer of insulating material 126 to reduce its overall thickness and thereby define a reduced thickness layer of insulating material 126A. The etching process may be either a wet or dry etching process. The final thickness 126T of the reduced thickness layer of insulating material 126A may vary depending upon the particular application. In one illustrative embodiment, the final thickness 126T of the reduced thickness layer of insulating material 126A may be about 10-20 nm. At this point in the fabrication process, the final height 120H of the fins 120 is set. The final desired height 120H of the fins 120 may vary depending upon the particular application. In one illustrative embodiment, using current-day technology, the final desired height 120H of the fins 120 may be approximately 15-40 nm.

Figure 2I:
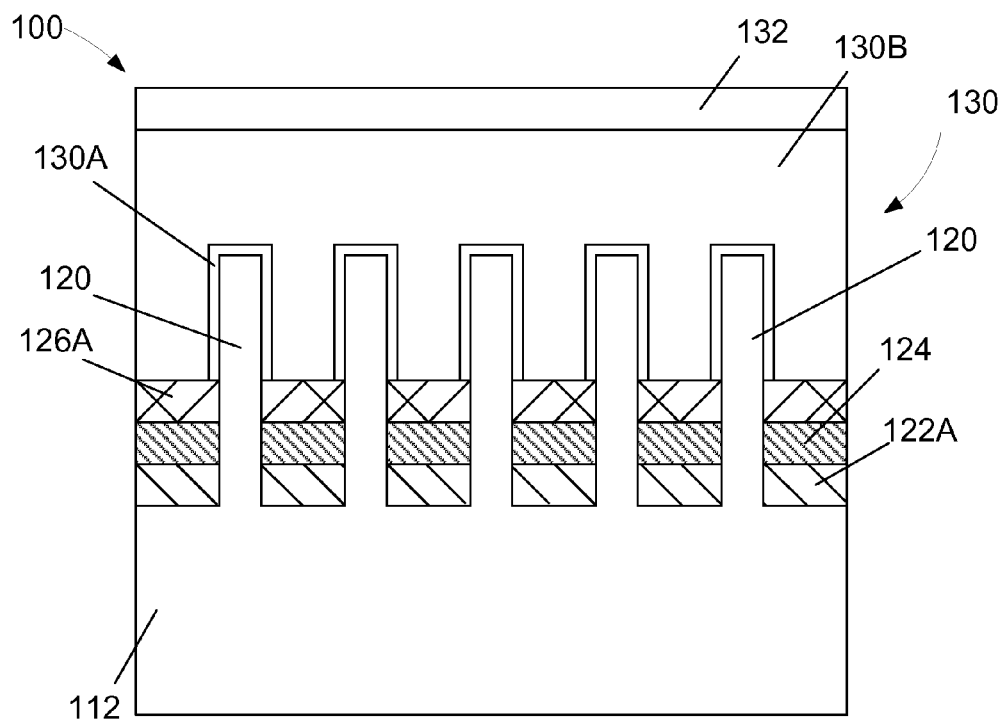
Figure 2J:
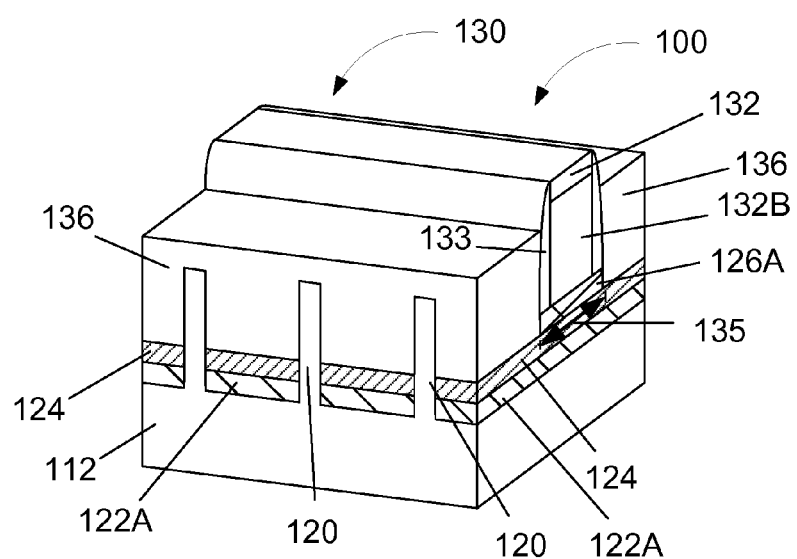

FIG. 2I depicts the device 100 after several process operations have been performed. More specifically, an illustrative gate electrode structure 130 has been formed on the device 100 using well-known techniques. In one illustrative embodiment, the schematically depicted gate structure 130 includes an illustrative gate insulation layer 130A and an illustrative gate electrode 130B. An illustrative gate cap layer 132 is formed above the illustrative gate electrode layer 130B. The gate insulation layer 130A may be comprised of a variety of different materials, such as, for example, silicon dioxide, a so-called high-k (k greater than 10) insulation material, etc. Similarly, the gate electrode 130B may also be of a material such as polysilicon or amorphous silicon, or it may be comprised of one or more metal layers that act as the gate electrode 130B. As will be recognized by those skilled in the art after a complete reading of the present application, the gate structure 130 of the device 100 depicted in the drawings, i.e., the gate insulation layer 130A and the gate electrode 130B, is intended to be representative in nature. That is, the gate structure 130 may be comprised of a variety of different materials and it may have a variety of configurations, and the gate structure 130 may be made using either so-called "gate-first" or "gate-last" techniques. In one illustrative embodiment, an oxidation process may be performed to form a gate insulation layer 130A comprised of silicon dioxide. Thereafter, the gate electrode material and the gate cap layer material 132 may be deposited above the device 100 and the layers may be patterned using known photolithographic and etching techniques. The gate cap layer 132 may be made of a variety of materials such as, for example, silicon nitride. Typically, sidewall spacers comprised of, for example, silicon nitride, are formed adjacent the gate electrode structure 130 to protect and electrically isolate the gate electrode structure, however, such spacers are not shown in FIG. 2I so as not to obscure the inventions disclosed herein. In general, the isolation layer 124 may act as an etch stop layer that prevents the loss of the reduced thickness layer of insulating material 122A during any subsequently performed etching processes. For example, the isolation layer 124 may act as an etch stop layer during an etching process that is performed to form conductive contacts proximate the gate structure 130. The methods disclosed herein may also involve the formation of source/drain regions (not shown) and conductive contacts (not shown) besides the gate structure 130, where the reduced thickness layer of insulating material 126A may be a sacrificial material and wherein the isolation layer 124 acts as an etch stop layer that constrains the maximum local isolation loss between fins 120, wherein the isolation layer acts as an etch stop layer that prevents the loss of the first layer of insulating material during an etching process performed to form conductive contacts proximate the gate structure FIG. 2J is a schematic, perspective view of one illustrative embodiment of the FinFET device 100 at a later stage of fabrication. In this embodiment, only three illustrative fins 120 are depicted. The device includes the reduced thickness layer of insulating material 122A, the isolation layer 124 and the second reduced thickness layer of insulating material 126A, as described above. Note that portions of the second reduced thickness layer of insulating material 126A that are positioned laterally outside of the gate area are typically removed in subsequent etching processes (wet HF acid steps or dry etching steps that etch silicon dioxide), wherein the isolation layer 124 serves as an etch stop layer to protect the underlying reduced thickness layer of insulating material 122A. In some cases, portions of the second reduced thickness layer of insulating material 126A positioned laterally outside of the gate area may remain, but having the isolation layer 124 (an etch stop layer) is still beneficial as, even if there are process variations, the isolation layer 124 serves to limit the maximum isolation loss to the thickness 126T of the layer 126. As noted above, the device 100 also includes the gate structure 130 and the gate cap layer 132. At the cross-section depicted in FIG. 2J, the gate insulation layer 130A is not present under the gate electrode 130B since, in this embodiment, the gate insulation layer was thermally grown. If the gate insulation layer 130A is a deposited layer in a gate-first process flow, then such a layer 130A would be visible under the gate electrode in the view depicted in FIG. 2J. It should also be noted that the gate structure drawn in FIG. 2J is just a general schematic representation. In a real-world device, the gate stack might look differently depending on the particular gate dielectrics and gate metals, or process flow that is used in forming the device (gate-last or gate-first). Also depicted in FIG. 2J are sidewall spacers 133 and a material layer 136 where source/drain regions will be formed for the device 100. In one embodiment, the material layer 136 may be a semiconducting material that merges the fins 120 together to form a source/drain region. In other cases, the layer 136 could represent a metal contact which consists of a metal silicide and a conductive metal, like tungsten or copper. The spacers 133 may be formed from a variety of materials, such as, for example, silicon nitride, silicon oxynitride, silicon dioxide, silicon carbon oxide, silicon carbon nitride, etc. The spacers 133 may be made by conformally depositing a layer of spacer material and thereafter performing an anisotropic etching process. Of course, the isolation layer 124 also may act as a local insulating material positioned adjacent the fins 120, wherein the isolation layer 124 is made of a material that, as noted above, is resistant to various cleaning processes, e.g., HF acid cleaning processes, performed to remove, for example, silicon dioxide material. Additionally, in some cases, the second reduced thickness layer of insulating material 126A may have a lateral dimension 135 (shown in FIG. 2J) that corresponds approximately to a gate length of the gate structure 130. It should by understood that by using the word "approximately" here and in the claims, it should cover the situation where the lateral dimension 135 of the second reduced thickness layer of insulating material 126A extends just to the edges of the gate structure 130 as well as situations where the second reduced thickness layer of insulating material 126A extends laterally outward under any sidewall spacers, such as the spacers 133 depicted in FIG. 2J. In this illustrative embodiment, the second reduced thickness layer of insulating material 126A has a lateral dimension 135 that is less than the lateral dimension of the isolation layer 124 and the lateral dimension of the reduced thickness layer of insulating material 122A.

Figure 3A:
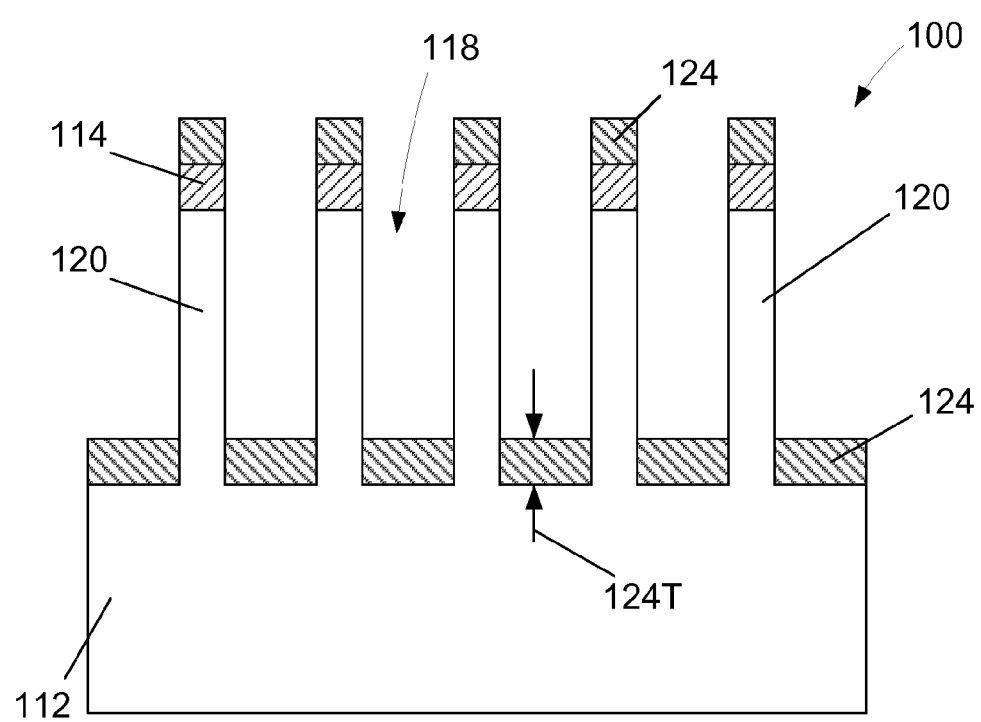
FIGS. 3A-3E depict another illustrative technique disclosed herein for forming isolation structures on FinFET semiconductor devices.

FIGS. 3A-3E depict another illustrative process flow disclosed herein for forming isolation structures on FinFET semiconductor devices. FIG. 3A depicts the illustrative FinFET semiconductor device 100 after several process operations have been performed. More specifically, an etching process, such as a dry or wet etching process, has been performed on the substrate 112 through the previously described patterned mask layer 114 to form the trenches 118 which also defines the fins 120. With continuing reference to FIG. 3A, the isolation layer 124 is formed at the bottom of the trenches 118 and on the patterned hard mask layer 114. In this illustrative embodiment, the isolation layer 124 may have a thickness of about 5-30 nm.

Figure 3B:
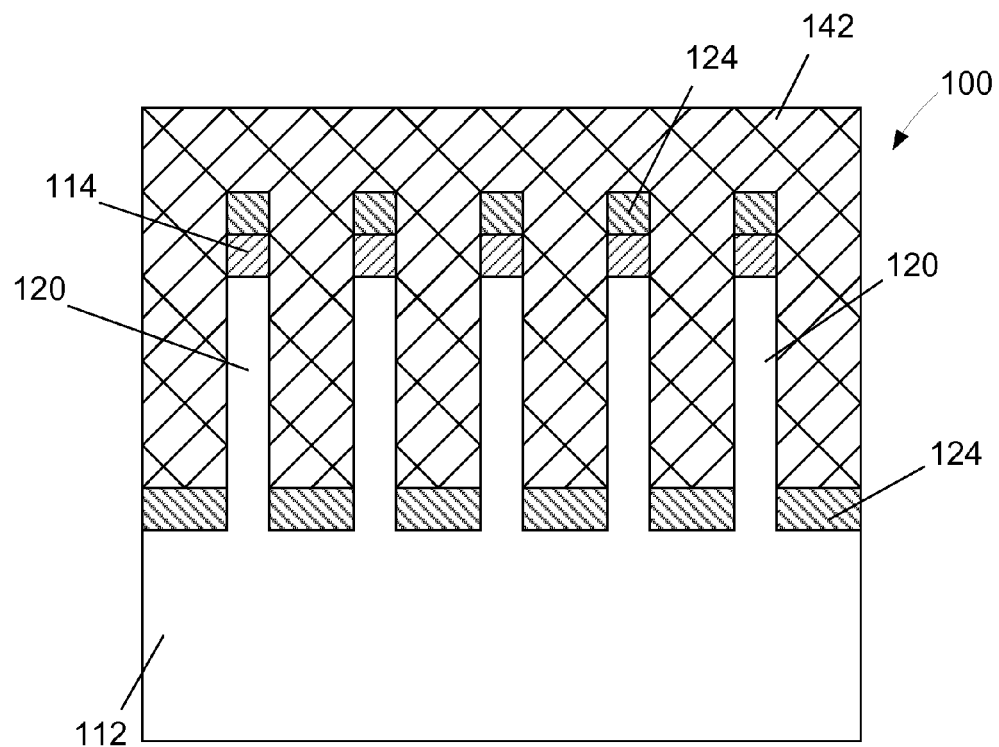

Next, as shown in FIG. 3B, a layer of insulating material 142 is deposited across the device 100 and overfills the trenches 118. The layer of insulating material 142 may be comprised of a variety of insulating materials, such as, for example, silicon dioxide, silicon carbon oxide, etc. The layer of insulating material 142 may be formed by performing a variety of known processing techniques, such as a chemical vapor deposition (CVD) process, an atomic layer deposition (ALD) process, or plasma-enhanced versions of such processes. In one illustrative embodiment, the layer of insulating material 142 is a layer of silicon dioxide that is initially formed by performing a plasma-enhanced CVD process.

Figure 3C:
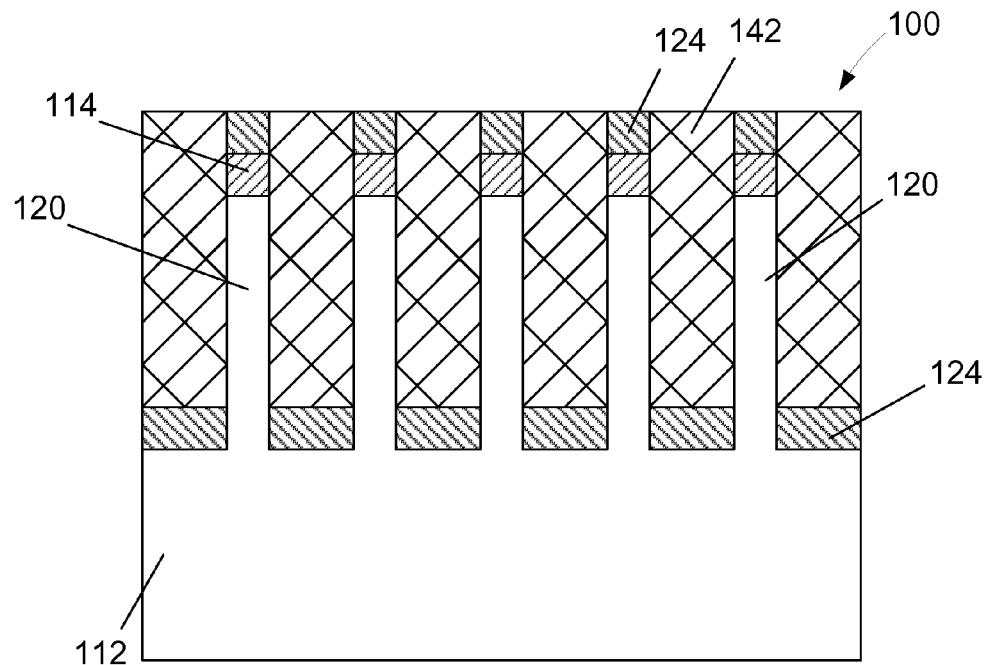
Figure 3D:
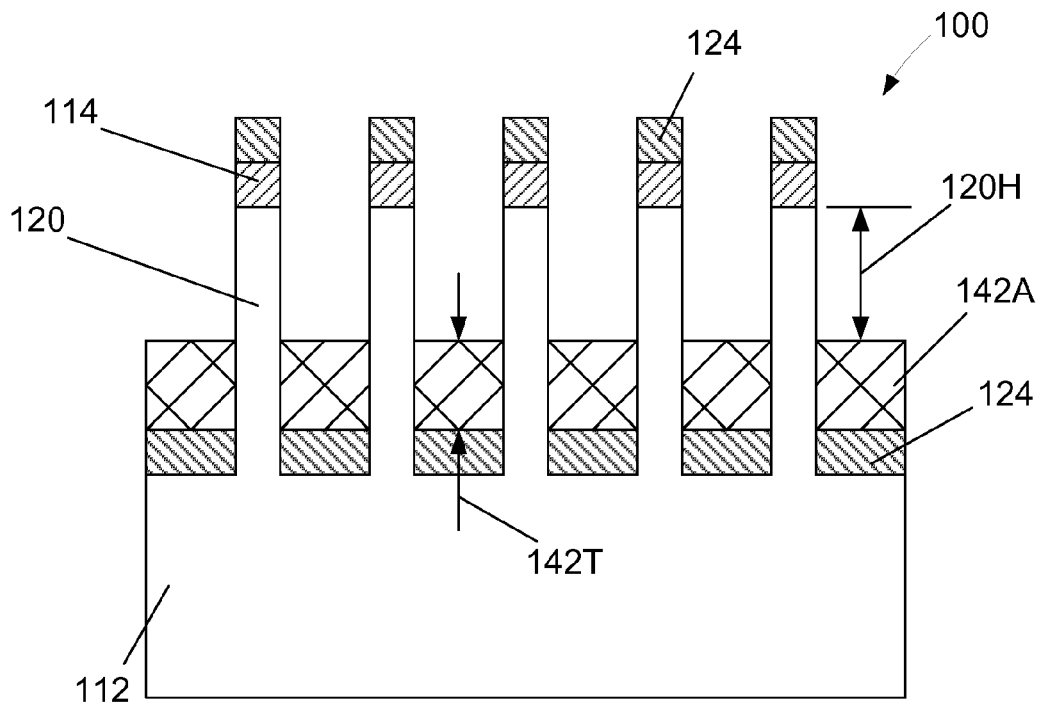

Next, as shown in FIG. 3C, a chemical mechanical polishing (CMP) process is performed on the device 100 using the isolation layer 124 as a polish-stop layer to remove portions of the layer of insulating material 142 and to planarize its surface. Then, as shown in FIG. 3D, one or more etching processes is performed on the layer of insulating material 142 to reduce its overall thickness and thereby define a reduced thickness layer of insulating material 142A. The etching process may be either a wet or dry etching process. The final thickness 142T of the reduced thickness layer of insulating material 142A may vary depending upon the particular application. In one illustrative embodiment, the final thickness 142T of the reduced thickness layer of insulating material 142A may be about 10-30 nm. At this point in the fabrication process, the final height 120H of the fins 120 is set. The final desired height 120H of the fins 120 may vary depending upon the particular application. In one illustrative embodiment, using current-day technology, the final desired height 120H of the fins 120 may be approximately 15-40 nm. At this point in the fabrication process, the gate structure 130 may be formed for the device using the illustrative techniques previously described, which will not be repeated.

Figure 3E:
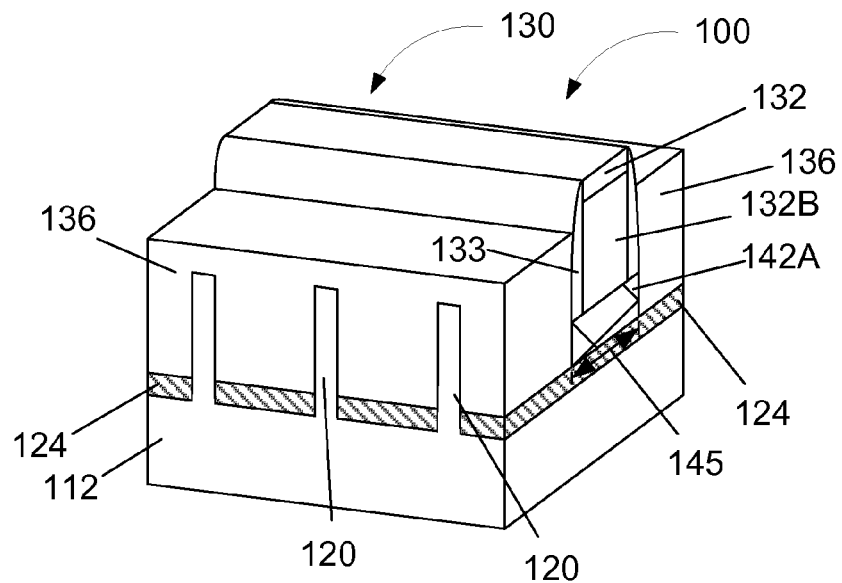

FIG. 3E is a schematic, perspective view of one illustrative embodiment of the FinFET device 100 at a later stage of fabrication. In this embodiment, only three illustrative fins 120 are depicted. The device 100 includes the isolation layer 124, as described above. Note that portions of the reduced thickness layer of insulating material 142A that are positioned laterally outside of the gate area are typically removed in subsequent etching processes (wet HF acid steps or dry etching steps that etch silicon dioxide), wherein the isolation layer 124 serves as an etch stop layer. In some cases, portions of the reduced thickness layer of insulating material 142A positioned laterally outside of the gate area may remain, but having the isolation layer 124 (an etch stop layer) is still beneficial as, even if there are process variations, the isolation layer 124 serves to limit the maximum isolation loss to the thickness 142T of the layer 142A. The device 100 also includes a gate structure 130 and a gate cap layer 132. Also depicted in FIG. 3E are sidewall spacers 133 and an illustrative material layer 136 that, as previously discussed, may be employed in forming source/drain regions for the device 100. The methods disclosed herein may also involve the formation of source/drain regions (not shown) and conductive contacts (not shown) besides the gate structure 130, where the reduced thickness layer of insulating material 142A may be a sacrificial material and wherein the isolation layer 124 acts as an etch stop layer that constrains the maximum local isolation loss between fins 120. Of course, the isolation layer 124 also may act as local insulating material positioned adjacent the fins 120, wherein the isolation layer 124 is made of a material that, as noted above, is resistant to various cleaning processes, e.g., HF acid cleaning processes, performed to remove, for example, silicon dioxide material. This insures that there will be a minimum amount of insulating material positioned adjacent the fins 120 even if the device is subjected to many etching/cleaning processes that are performed to remove silicon dioxide material. Additionally, in some cases, the reduced thickness layer of insulating material 142A may have a lateral dimension 145 (shown in FIG. 3E) that corresponds approximately to a gate length of the gate structure 130. It should by understood that by using the word "approximately" here and in the claims, it should cover the situation where the lateral dimension 135 of the reduced thickness layer of insulating material 142A extends just to the edges of the gate structure 130 as well as situations where the reduced thickness layer of insulating material 142A extends laterally outward under any sidewall spacers, such as the spacers 133 depicted in FIG. 3E. In this illustrative embodiment, the reduced thickness layer of insulating material 142A has a lateral dimension 145 that is less than the lateral dimension of the isolation layer 124.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming isolation structures for a FinFET device, comprising:
    performing at least one etching process on a semiconducting substrate to form a plurality of trenches and a plurality of fins for said FinFET device in said substrate;
    forming an isolation layer in said trenches, said isolation layer having an upper surface that is below an upper surface of said substrate;
    forming a layer of insulating material above said isolation layer, said layer of insulating material having an upper surface that is below said upper surface of said substrate; and
    forming a gate structure above said isolation layer.

2. The method of claim 1, wherein said layer of insulating material is comprised of silicon dioxide and said isolation layer is comprised of silicon nitride.

3. The method of claim 1, wherein forming said isolation layer comprises performing a directional deposition process to form said isolation layer.

4. The method of claim 1, wherein said directional deposition process is a gas cluster ion beam process.

5. The method of claim 4, wherein said gas cluster ion beam process is performed at about room temperature and at an energy level ranging from about 5-60 keV using $SiH_4$ and $N_2$ clusters.

6. The method of claim 1, wherein forming said layer of insulating material comprises:
    depositing said layer of insulating material above said isolation layer and so as to overfill said trenches;
    performing a chemical mechanical polishing process on said deposited layer of insulating material; and
    performing an etching process on said layer of insulating material such that, when the etching process is completed, its upper surface is below said upper surface of said substrate.

7. The method of claim 1, wherein said layer of insulating material is comprised of silicon dioxide and said isolation layer is comprised of a material that is resistant to etching with hydrofluoric acid.

8. A method of forming isolation structures for a FinFET device, comprising:
    performing at least one etching process on a semiconducting substrate to form a plurality of trenches and a plurality of fins for said FinFET device in said substrate;
    forming a first layer of insulating material in said trenches, said first layer of insulating material having an upper surface that is below an upper surface of said substrate;

forming an isolation layer within said trenches above said first layer of insulating material, said isolation layer having an upper surface that is below said upper surface of said substrate;

forming a second layer of insulating material above said isolation layer, said second layer of insulating material having an upper surface that is below said upper surface of said substrate; and forming a gate structure above said second layer of insulating material.

9. The method of claim 8, wherein said first and second layers of insulating material are comprised of silicon dioxide and said isolation layer is comprised of a material that is resistant to etching with hydrofluoric acid.

10. The method of claim 9, wherein said isolation layer is comprised of silicon nitride.

11. The method of claim 8, wherein forming said first layer of insulating in said trenches comprises:

depositing said first layer of insulating material so as to overfill said trenches;

performing a chemical mechanical polishing process on said deposited first layer of insulating material; and performing an etching process on said first layer of insulating material such that, when the etching process is completed, its upper surface is below said upper surface of said substrate.

12. The method of claim 8, wherein forming said isolation layer comprises performing a directional deposition process to form said isolation layer.

13. The method of claim 12, wherein said directional deposition process is a gas cluster ion beam process.

14. The method of claim 13, wherein said gas cluster ion beam process is performed at about room temperature and at an energy level ranging from about 5-60 keV using $SiH_4$ and $N_2$ clusters.

15. The method of claim 8, wherein said isolation layer is a layer of insulating material.

16. The method of claim 8, wherein forming said second layer of insulating material in said trenches comprises:

depositing said second layer of insulating material above said isolation layer and so as to overfill said trenches;

performing a chemical mechanical polishing process on said deposited second layer of insulating material; and performing an etching process on said second layer of insulating material such that, when the etching process is completed, its upper surface is below said upper surface of said substrate.

17. The method of claim 8, wherein said first layer of insulating material has a thickness that falls within the range of 10-70 nm, said isolation layer has a thickness that falls within the range of 5-30 nm and said second layer of insulating material has a thickness that falls within the range of 10-20 nm.

18. The method of claim 8, wherein said isolation layer acts as an etch stop layer that prevents the loss of said first layer of insulating material during a subsequent etching process.

19. The method of claim 18, wherein said isolation layer acts as an etch stop layer that prevents the loss of said first layer of insulating material during an etching process performed to form conductive contacts proximate said gate structure.

* * * * *